(12) United States Patent
Emadi et al.

(10) Patent No.: US 10,132,679 B2
(45) Date of Patent: Nov. 20, 2018

(54) ULTRAVIOLET SENSOR HAVING FILTER

(71) Applicant: Maxim Integrated Products, Inc., San Jose, CA (US)

(72) Inventors: Arvin Emadi, Santa Clara, CA (US); Nicole D. Kerness, Menlo Park, CA (US); Cheng-Wei Pei, Belmont, CA (US); Joy T. Jones, Fremont, CA (US); Arkadii V. Samoilov, Saratoga, CA (US); Ke-Cai Zeng, Fremont, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 110 days.

(21) Appl. No.: 14/580,406

(22) Filed: Dec. 23, 2014

(65) Prior Publication Data
US 2015/0338273 A1 Nov. 26, 2015

Related U.S. Application Data

(60) Provisional application No. 62/002,211, filed on May 23, 2014.

(51) Int. Cl.
*G01J 1/04* (2006.01)
*G01J 1/42* (2006.01)
*H01L 31/0216* (2014.01)

(52) U.S. Cl.
CPC .............. *G01J 1/429* (2013.01); *G01J 1/0488* (2013.01); *H01L 31/02162* (2013.01)

(58) Field of Classification Search
CPC ..................................................... G01J 1/429
See application file for complete search history.

(56) References Cited

U.S. PATENT DOCUMENTS 4,310,243 A * 1/1982 Brown ................... H01J 40/14
250/207
4,910,570 A 3/1990 Popovic
(Continued)

FOREIGN PATENT DOCUMENTS

| CA | 2106949 A1 * | 3/1995 | ............... G02B 5/28 |
| CN | 103226216 A | 7/2013 | |
| JP | 200346112 A | 2/2003 | |

OTHER PUBLICATIONS

Van Den Berg et al., Light transmittance of the human cornea from 320 to 700 nm for different ages, 1994, Vision Research, vol. 34, Iss. 11, pp. 1453-1456.*

(Continued)

*Primary Examiner* — Casey Bryant
*Assistant Examiner* — Jeremy S Valentiner
(74) *Attorney, Agent, or Firm* — Kevin E. West; Advent, LLP

(57) ABSTRACT

Techniques are provided to furnish a light sensor that includes a filter positioned over a photodetector to filter visible and infrared wavelengths to permit the sensing of ultraviolet (UV) wavelengths. In one or more implementations, the light sensor comprises a semiconductor device (e.g., a die) that includes a substrate. A photodetector (e.g., photodiode, phototransistor, etc.) is formed in the substrate proximate to the surface of the substrate. In one or more implementations, the substrate comprises a silicon on insulator substrate (SOI). A filter (e.g., absorption filter, interference filter, flat pass filter, McKinlay-Diffey Erythema Action Spectrum-based filter, UVA/UVB filter, and so forth) is disposed over the photodetector. The filter is configured to filter infrared light and visible light from light received by the light sensor to at least substantially block infrared light and visible light from reaching the photodetector. The thick- (Continued)

ness of the SOI substrate can be tailored to modify received UV/visible wavelength ratios.

18 Claims, 4 Drawing Sheets

(56) References Cited

U.S. PATENT DOCUMENTS

| | | | | |
|---|---|---|---|---|
| 5,394,237 | A * | 2/1995 | Chang | G01J 3/02 |
| | | | | 250/339.02 |
| 5,726,440 | A | 3/1998 | Kalkhoran et al. | |
| 6,323,491 | B1 * | 11/2001 | Forsyth | G01J 1/429 |
| | | | | 250/214 VT |
| 6,426,503 | B1 * | 7/2002 | Wuest | G01J 1/429 |
| | | | | 250/372 |
| 6,587,264 | B2 * | 7/2003 | Knapp | G01J 1/429 |
| | | | | 359/308 |
| 2002/0096728 | A1 * | 7/2002 | Kuhlmann | G01J 1/429 |
| | | | | 257/432 |
| 2003/0218797 | A1 * | 11/2003 | Kuklinski | A61B 5/441 |
| | | | | 359/359 |
| 2006/0044427 | A1 * | 3/2006 | Hu | H04N 9/07 |
| | | | | 348/266 |
| 2006/0261381 | A1 | 11/2006 | Chiou | |
| 2008/0237763 | A1 * | 10/2008 | Miura | H01L 27/144 |
| | | | | 257/432 |
| 2009/0218504 | A1 * | 9/2009 | Pelizzo | G01J 1/04 |
| | | | | 250/372 |
| 2012/0187281 | A1 * | 7/2012 | Kerness | H01L 27/14618 |
| | | | | 250/214.1 |
| 2014/0054461 | A1 | 2/2014 | Kalnitsky et al. | |

OTHER PUBLICATIONS

Zhang, The Human Eye Can See in Ultraviolet When the Lens is Removed, Apr. 2012, PetaPixel, available online at http://petapixel.com/2012/04/17/the-human-eye-can-see-in-ultraviolet-when-the-lens-is-removed/.*
Aggarwal, ICSE Biology Book-II for Class-X, May 2016, S Chand, p. 112.*
Lucas, What is Visible Light?, Apr. 2015 Livescience, available at http://www.livescience.com/50678-visible-light.html, accessed Jan. 18, 2017.*
Official Action dated Nov. 23, 2017 for Chinese Appln. No. 201510404026.7.
Chinese Office Action for Chinese Application No. 201510404026.7, dated Aug. 24, 2018.

* cited by examiner

500

```
┌─────────────────────────────────────────────┐
│ FORM A PHOTODETECTOR IN A SURFACE OF A SUBSTRATE │
│                    502                      │
└─────────────────────────────────────────────┘
                      ↓
┌─────────────────────────────────────────────┐
│   FORM A FILTER OVER A SURFACE OF THE SUBSTRATE │
│                    504                      │
│   ┌─────────────────────────────────────┐   │
│   │  COAT A WAFER WITH A PHOTORESIST MATERIAL │
│   │               506                   │   │
│   └─────────────────────────────────────┘   │
│                    ↓                        │
│   ┌─────────────────────────────────────┐   │
│   │  DEPOSIT THE FILTER MATERIAL ON THE SURFACE │
│   │               508                   │   │
│   └─────────────────────────────────────┘   │
│                    ↓                        │
│   ┌─────────────────────────────────────┐   │
│   │  PERFORM LIFT OFF TECHNIQUE TO REMOVE │
│   │        PHOTORESIST MATERIAL         │   │
│   │               510                   │   │
│   └─────────────────────────────────────┘   │
└─────────────────────────────────────────────┘
                      ↓
┌─────────────────────────────────────────────┐
│        SINGULATE A SENSOR FROM THE WAFER    │
│                    512                      │
└─────────────────────────────────────────────┘
                      ↓
┌─────────────────────────────────────────────┐
│              PACKAGE THE SENSOR             │
│                    514                      │
└─────────────────────────────────────────────┘
```

FIG. 5

ULTRAVIOLET SENSOR HAVING FILTER

CROSS-REFERENCE TO RELATED APPLICATIONS

The present application claims the benefit under 35 U.S.C. § 119(e) of U.S. Provisional Application Ser. No. 62/002,211, entitled ULTRAVIOLET SENSOR HAVING FILTER, filed May 23, 2014. U.S. Provisional Application Ser. No. 62/002,211 is hereby incorporated by reference in its entirety.

BACKGROUND

Electronic devices, such as smart phones, tablet computers, digital media players, and so forth, increasingly employ light sensors to control the manipulation of a variety of functions provided by the device. For example, light sensors may be used by an electronic device to detect environmental conditions, such as ambient lighting conditions in order to control the brightness of the device's display screen. Typical light sensors employ photodetectors such as photodiodes, phototransistors, or the like, which convert received light into an electrical signal (e.g., a current or voltage).

SUMMARY

A light sensor is described that includes a filter positioned over a photodetector to filter visible and infrared wavelengths to permit the sensing of ultraviolet (UV) wavelengths. In one or more implementations, the light sensor comprises a semiconductor device (e.g., a die) that includes a substrate. A photodetector (e.g., photodiodes, phototransistors, etc.) is formed in the substrate proximate to the surface of the substrate. In one or more implementations, the substrate comprises a silicon on insulator substrate (SOI), such as a thin film silicon on insulator (TFSOI) substrate. A filter (e.g., absorption filter, interference filter, flat pass filter, McKinlay-Diffey Erythema Action Spectrum-based filter, UVA/UVB filter, and so forth) is disposed over the photodetector. The filter is configured to filter infrared light and visible light from light received by the light sensor to at least substantially block infrared light and visible light from reaching the photodetector. The thickness of the SOI substrate can be tailored to modify received UV/visible wavelength ratios.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. The use of the same reference numbers in different instances in the description and the figures may indicate similar or identical items.

FIG. 5 is a flow diagram illustrating an example process in an example implementation for fabricating light sensors having a filter positioned over a photodetector having a silicon on insulator (SOI) substrate in accordance with the present disclosure.

DETAILED DESCRIPTION

Overview

To filter light, light sensors may employ blocking filters to reduce the transmission of a particular set or sets of wavelengths, while passing the remaining wavelengths to the photodetector of the light sensor. Ultraviolet (UV) sensors are configured to detect light in the ultraviolet wavelength spectrum from about 280 nm to about 400 nm. The substrates of UV sensors contribute to cost, quantum efficiency (QE), and the amount of undesired wavelengths that are to be filtered from the photodetector.

A light sensor is described that includes a filter positioned over a photodetector to filter visible and infrared wavelengths to permit the sensing of UV wavelengths. In one or more implementations, the light sensor comprises a semiconductor device (e.g., a die) that includes a substrate. A photodetector (e.g., one or more photodiodes, phototransistors, etc.) is formed in the substrate proximate to the surface of the substrate. In one or more implementations, the substrate comprises a silicon on insulator substrate (SOI), such as a thin film silicon on insulator (TFSOI) substrate. The thickness of the SOI can influence the amount of visible light that would be detected by the photodetector. For example, a thicker SOI layer generally facilitates detection of a broader spectrum of visible light than would a thinner SOI layer. The thickness of the SOI also can influence the quantum efficiency of the photodetector, where the thicker the SOI layer, the higher the quantum efficiency. A filter (e.g., absorption filter, interference filter, flat pass filter, McKinlay-Diffey Erythema Action Spectrum-based filter, UVA/UVB filter, and so forth) is disposed over the photodetector to filter infrared light and visible light from light received by the light sensor to at least substantially block infrared light and visible light from reaching the photodetector. In implementations, the filter is positioned on the surface of the substrate and positioned over the photodetector to filter infrared light and visible light from light received by the light sensor.

The thickness of the SOI substrate can be tailored to modify the ratio of UV wavelengths and visible wavelengths received by the photodetector. Additionally, the SOI layer can be configured with horizontal junctions, vertical junctions, ultrashallow dopant profiles through laser annealing techniques, and ultrashallow profiles through Epi growth techniques and/or etching techniques.

In the following discussion, example implementations of light sensors that include filters to permit the sensor to measure UV wavelengths are first described. Example procedures are then discussed that may be employed to fabricate the example light sensor.

Example Implementations

Figure 1:
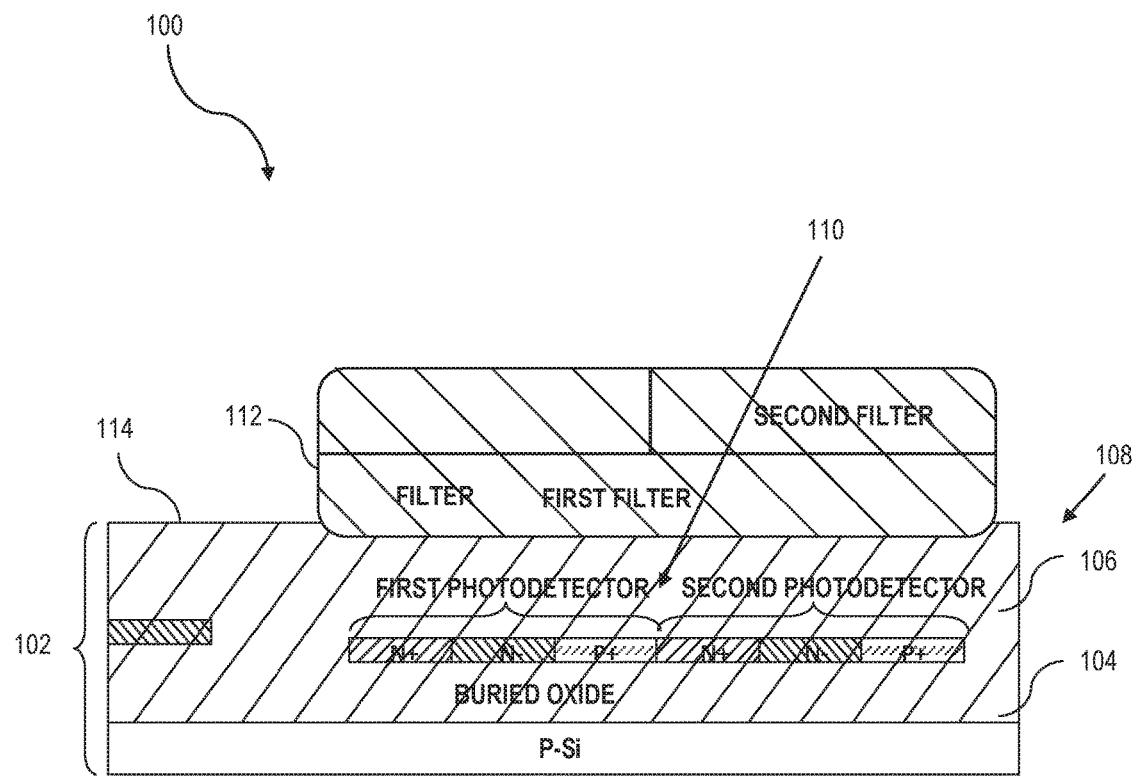
FIG. 1 is a diagrammatic cross-sectional view illustrating an ultraviolet (UV) sensor in accordance with an example implementation of the present disclosure.

FIG. 1 illustrates light sensors 100 in accordance with example implementations of the present disclosure. As shown, the light sensors 100 comprise semiconductor devices that include a die having a substrate 102. The substrate 102 furnishes a base material utilized to form one or more electronic devices through various fabrication techniques such as photolithography, ion implantation, deposition, etching, and so forth. The substrate 102 may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon) (FIG. 1 displays a p-type silicon layer 104). The substrate 102 further may be comprised of one or more insulating layers 106, such as a buried oxide layer, to provide a silicon on insulator (SOI) substrate.

The substrate 102 includes a photodetector 108 having one or more photodetector regions 110. In the implementation shown in FIG. 1, the photodetector regions 110 are positioned between two insulating layers 106, to separate the photodetector regions 110 from the p-type silicon layer 104. The photodetector regions 110 of the substrate 102 may be configured in a variety of ways. For example, the photodetector regions 110 may be comprised of a photo sensor diode, a phototransistor, or the like. The photodetector regions 110 shown in FIG. 1 are provided in a lateral diode arrangement, however the photodetector regions 110 are not limited to a lateral arrangement and can include additional or alternative arrangements including, but not limited to, vertical diode arrangements. For instance, the photodetector regions 110 can be configured as vertical junctions or horizontal junctions. In an implementation, the photodetector 108 is capable of detecting light and providing a signal in response thereto. The photodetector regions 110 may provide a signal by converting light into current or voltage based upon the intensity of the detected light. Thus, once a photodetector region is exposed to light, multiple free electrons may be generated to create a current. The photodetector 108 is configured to detect light in the ultraviolet light spectrum. As used herein, the term light is contemplated to encompass electromagnetic radiation occurring in the ultraviolet light spectrum. The ultraviolet light spectrum (ultraviolet light) includes electromagnetic radiation occurring in the range of wavelengths from approximately one hundred (100) nanometers to approximately four hundred (400) nanometers. Ultraviolet light includes light in the UVA, UVB, and UVC spectrums. The UVA light spectrum (UVA light) includes electromagnetic radiation occurring in the range of wavelengths from approximately four hundred (400) nanometers to approximately three hundred fifteen (315) nanometers. The UVB light spectrum (UVB light) includes electromagnetic radiation occurring in the range of wavelengths from approximately three hundred fifteen (315) nanometers to approximately two hundred eighty (280) nanometers. The UVC light spectrum (UVC light) includes electromagnetic radiation occurring in the range of wavelengths from approximately two hundred eighty (280) nanometers to approximately one hundred (100) nanometers. In implementations, the photodetector regions 110 are configured to receive and detect light in the ultraviolet light spectrum, which has a relatively shallow penetration depth as compared to light having wavelengths in the IR spectrum, the green spectrum, the blue spectrum, and so forth. For example, in an implementation, the photodetector regions 110 have a thickness of thirty nanometers to facilitate the capture light in the ultraviolet light spectrum. The thickness of the photodetector regions 110 can vary (i.e., can be greater than or less than thirty nanometers) due to fabrication techniques, physical tolerances of materials utilized, desired wavelengths to capture, and the like.

Figure 2:
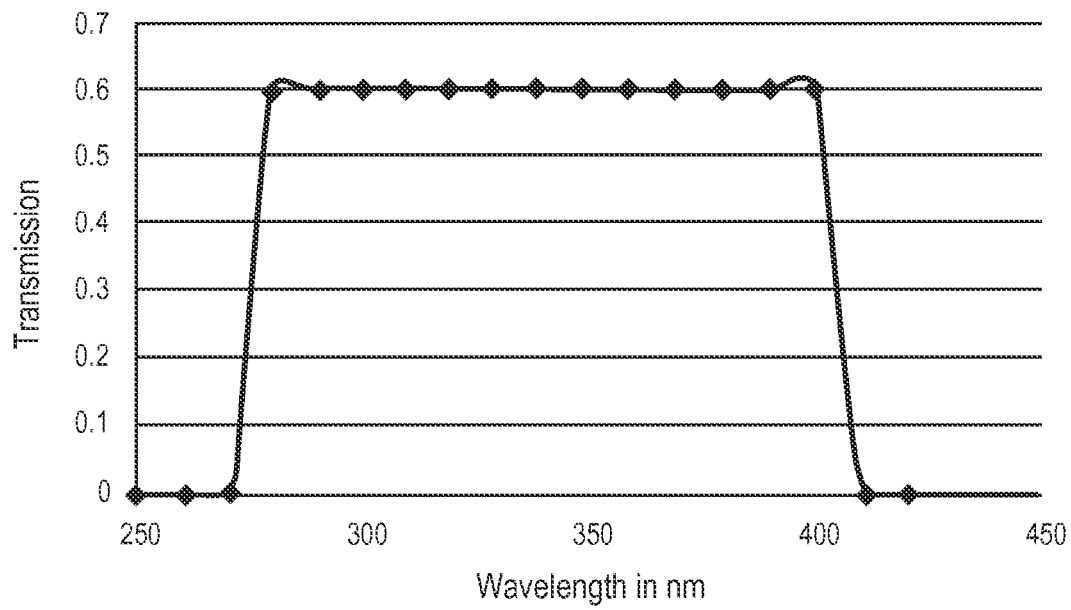
FIG. 2 is a chart showing transmission response over various wavelengths for a filter for a UV sensor in accordance with an example implementation of the present disclosure.
Figure 3:
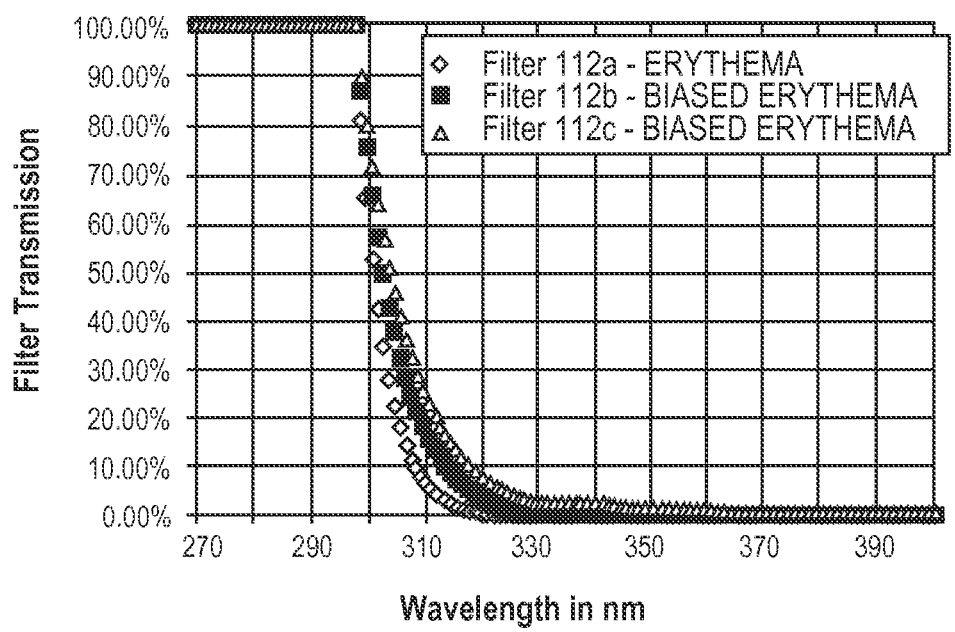
FIG. 3 is a linear-scale chart showing transmission response over various wavelengths for various McKinlay-Diffey Erythema Action Spectrum-based filters for a UV sensor in accordance with an example implementation of the present disclosure.
Figure 4:
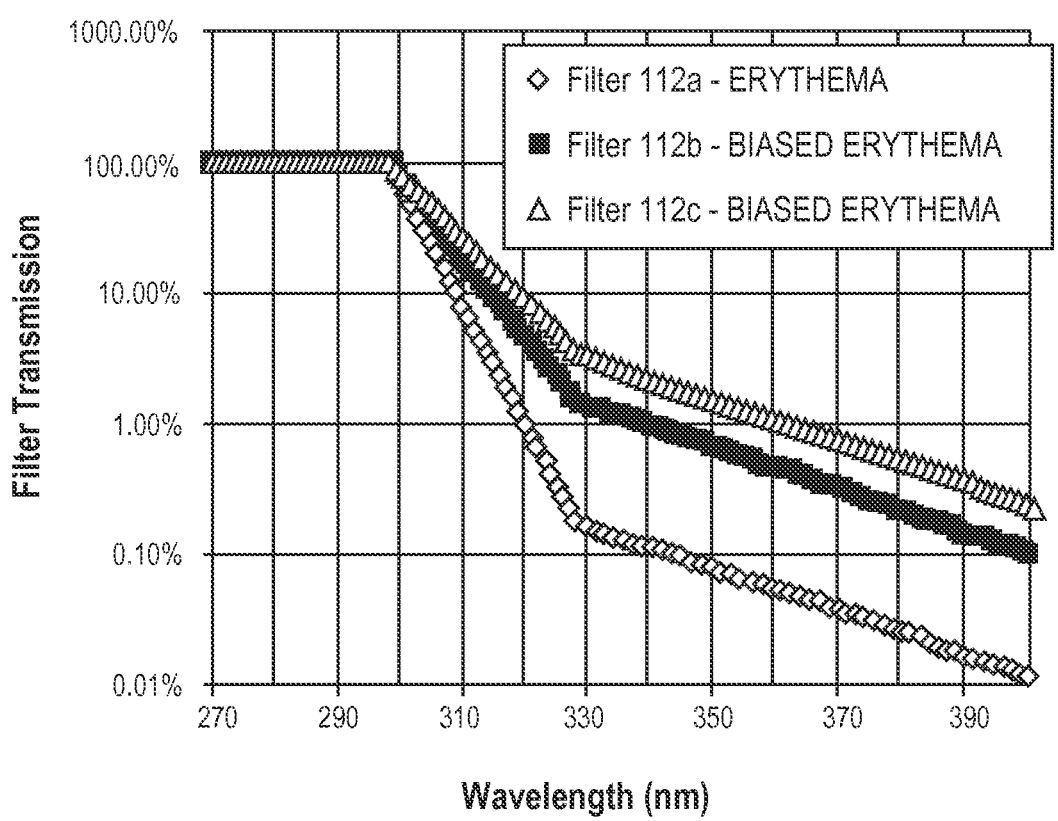
FIG. 4 is a log-scale chart showing transmission response over various wavelengths for various McKinlay-Diffey Erythema Action Spectrum-based filters for a UV sensor in accordance with an example implementation of the present disclosure.

The light sensors 100 include a filter 112 positioned proximate to a surface 114 of the substrate 102 (FIG. 1 shows the filter 112 positioned on top of the surface 114 of the substrate 102). The filter 112 is configured to filter light received by the light sensor 100 to thereby pass light in a limited spectrum of wavelengths (e.g., light having wavelengths between a first wavelength and a second wavelength) to the photodetector 108, such as to at least one of the photodetector regions 110. In implementations, the filter 112 comprises a dielectric material configured to filter portions of the light spectrum, while permitting passage of other portions of the light spectrum. For example, in an implementation, the filter 112 comprises a hafnium oxide filtering material, such as hafnium (IV) oxide (e.g., $HfO_2$), which does not significantly absorb ultraviolet light, and instead permits passage of UV light to function as a UV filter. In implementations, the filter 112 comprises a multi-layered structure, such as a plurality of dielectric layers in a stacked configuration. Example transmission response charts for example filters 112 are shown in FIGS. 2-4. FIG. 2 provides example minimum transmission responses of an example filter 112 corresponding to wavelengths between approximately 250 nanometers and 450 nanometers. As can be seen, the filter 112 substantially blocks transmission of light having wavelengths of less than approximately 280 nanometers and greater than 400 nanometers, while providing substantial transmission of light between 280 nanometers and 400 nanometers. FIG. 3 provides a linear-scale chart of transmission responses of example filters 112 (transmission responses for three example filters 112 are shown, labeled as 112a, 112b, and 112c) over wavelengths between approximately 270 nanometers and 400 nanometers. The transmission responses 112a correspond to transmission responses for a McKinlay-Diffey Erythema Action Spectrum-based filter, whereas the transmission responses 112b and 112c correspond to transmission responses for two biased McKinlay-Diffey Erythema Action Spectrum-based filters. FIG. 4 provides a log-scale chart of transmission responses of example filters 112 (transmission responses for three example filters 112 are shown, labeled as 112a, 112b, and 112c) over wavelengths between approximately 270 nanometers and 400 nanometers. The transmission responses 112a correspond to transmission responses for a McKinlay-Diffey Erythema Action Spectrum-based filter, whereas the transmission responses 112b and 112c correspond to transmission responses for two biased McKinlay-Diffey Erythema Action Spectrum-based filters. In implementations, the filter 112 is configured to block visible light and infrared light, while permitting passage of ultraviolet light (e.g., UVA and UVB light). The filter 112 can be formed proximate the surface 114 of the substrate 102 through deposition techniques, such as magnetron sputtering or other techniques. In implementations, the deposition techniques allow for patterned deposition of the filter on the surface 114 of the substrate 102.

The filter 112 is configured to incorporate one or more of an absorption filter, an interference filter, a flat pass filter, a McKinlay-Diffey Erythema Action Spectrum-based filter, a UVA/UVB filter, and so forth, configured to block visible light and infrared light, while permitting passage of ultraviolet light to the photodetector 108. For instance, the filter 112 can be configured such that the photodetector 108 has a maximum response to UVA and UVB wavelengths. In implementations, the filter 112 can be configured to block either UVA light or UVB light to cause the photodetector 108 to detect UVB light or UVA light, respectively, resulting in a UVB or a UVA sensor. For example, the filter 112 can be configured to block light having wavelengths of between four hundred (400) nanometers and three hundred fifteen (315) nanometers (the UVA spectrum), while permitting passage of light having wavelengths between three hundred fifteen (315) nanometers and two hundred eighty (280) nanometers (the UVB spectrum) to result in a UVB sensor. In implementations the filter 112 passes each of UVA and UVB light to the photodetector 108. In implementations, the filter 112 includes a first filter and a second filter, and the photodetector 108 includes a first photodetector and a second photodetector in the substrate 102, where the first filter is configured to block visible light and to pass UVA light and UVB light to the first photodetector, where the second filter is configured to block visible light and to pass UVA light to the second photodetector, and wherein a signal output from the first photodetector subtracted by a signal output from the second photodetector (i.e., a difference between the outputs from the first and second photodetectors) provides an indication of UVB light detected by the light sensor 100. In implementations, the filter 112 includes a weighting functionality to match the McKinlay-Diffey Erythema Action Spectrum, such as by providing a weighting factor for output corresponding to wavelengths that adjust for the sensitivity of human skin to UV radiation, where shorter wavelengths can cause more skin damage than longer UV wavelengths of the same intensity. For example, in implementations, the filter 112 is tailored to provide a McKinlay-Diffey Erythema Action response by accounting for the response by the photodetector 108 to result in a McKinlay-Diffey Erythema Action Spectrum to provide a UV index value. In implementations, the filter 112 is configured as an intermediate McKinlay-Diffey Erythema Action Spectrum filter by controlling the amount of UVA and UVB light passed to the photodetector 108, such as by permitting passage of more UVA light than UVB light, to increase the signal at the photodetector 108 to discern a UV index value. The filter 112 can be configured with a cutoff angle that can have a steep cutoff for transmission values before 400 nm, a gradual cut off, or so forth. For example, in implementations the filter 112 is configured to have a relaxed cutoff angle to reduce the response variation over the angle. In implementations, the light sensor 100 includes a filter 112 configured to pass all light wavelengths to a first photodetector 108 and includes a filter (e.g., filter 112, a different portion of filter 112, an additional filter, and so forth) that is configured to block at least a portion of UV light to a second photodetector (not shown). A signal for the amount of UV light present can be obtained by subtracting the signal resulting from the second photodetector from the signal resulting from the first photodetector 108.

In implementations, the light sensors 100 include a filter (e.g., filter 112, an additional filter, a separate filter, or so forth) configured to filter all light from entering the photodetector 108. In such a configuration, a dark channel cancellation technique can be implemented by measuring the dark current resulting from the photodetector 108 when no light reaches the photodetector 108, such as through complete blocking or filtering of light, and subtracting the dark current from subsequent measurements when light is permitted to reach the photodetector 108.

One or more regions of the substrate 102 can include a modified structural profile through one or more modification techniques. For example, one or more regions of the substrate 102 can be modified via a laser anneal process to have an ultrashallow dopant profile. In implementations, where the regions 110 are configured as a horizontal junction, an ultrashallow profile can be formed via epitaxy (Epi) growth techniques and/or etching techniques.

In various implementations, light sensors 100 are configured as blue light sensors (e.g., configured to sense light in the range of between approximately 450 nanometers and 495 nanometers). For example, the substrate 102 can be configured as a silicon on insulator (SOI) substrate with filter 112 being configured to block ultraviolet light from the photodetector 108. The photodetector 108 is configured to detect the blue light spectrum of wavelengths and to provide a signal in response thereto. The thickness of the SOI substrate can be tailored to filter higher wavelengths, such as by adjusting the thickness of the SOI substrate, in combination with the filtering capabilities of the filter, such that the light sensors 100 function as blue light sensors.

In various implementations, the light sensors 100 described herein may be configured to detect a surrounding light environment and/or to provide ultraviolet light detection. The filter 112 is configured to filter visible and infrared light and pass light in a limited spectrum of wavelengths to the respective photodetector 108. The photodetector 108 generates a signal (e.g., current value) based upon the intensity of the light. The signal generated by the photodetector 108 may be utilized by other circuit devices and/or applications to control various aspects of a portable electronic device (e.g., generate a UV index value, determine a day/night status, and so forth). A filter may be utilized to obtain a dark current value to provide dark channel cancellation of measurements at the photodetector 108 of light filtered by the filter 112. The light sensors 100 can incorporate a silicon on insulator (SOI) substrate, whereby the light sensors 100 can provide increased performance to electronic devices implementing such sensors.

Example Fabrication Process

The following discussion describes example techniques for fabricating a light sensor that includes an ultraviolet light filter configured to restrict the passage of visible and infrared from passing to a photodetector of the sensor. It is contemplated that light sensors in accordance with the present disclosure may be fabricated using fabricated utilizing complementary metal-oxide-semiconductor (CMOS) processing techniques, other semiconductor chip fabrication/packaging technologies, such as wafer-level packaging (WLP), and so on.

FIG. 5 depicts a process 500, in an example implementation, for fabricating a light sensor, such as the example light sensors 100 illustrated in FIG. 1 described above. In the process 500 illustrated, one or more photodetectors are formed in a substrate of a wafer (Block 502). As noted in the discussion of FIG. 1, the substrate may comprise n-type silicon (e.g., silicon doped with a group V element (e.g., phosphorus, arsenic, antimony, etc.) to furnish n-type charge carrier elements to the silicon) or p-type silicon (e.g., silicon doped with a group IIIA element (e.g., boron, etc.) to furnish p-type charge carrier elements to the silicon) (FIG. 1 displays a p-type silicon layer 104). The substrate may further be comprised of one or more insulating layers, such as a buried oxide layer, to provide a silicon on insulator (SOI) substrate. Thus, the substrate furnishes a base material utilized to form one or more photodetectors as well as other electronic devices of the light sensor. The one or more photodetectors may comprise photodiodes, phototransistors, or the like, formed in the substrate of the wafer using suitable fabrication techniques such as photolithography, ion implantation, deposition, etching, and so forth. In one or more implementations, at least one photodetector comprises an ultraviolet photodetector that is configured to detect ultraviolet light (light in the ultraviolet spectrum).

A filter is formed over a surface of the substrate (Block 504). For example, in various implementations, the filter is formed by coating a wafer (having one or more ultraviolet sensors formed therein) with a photoresist material (Block 506), and subsequently depositing the filter material (Block 508) onto the surface, such as by a deposition technique (e.g., magnetron sputtering, and so forth). The photoresist material (and any associated filter material deposited onto the photoresist material) is removed from the surface of the substrate by a lift off technique (Block 510). The process 500 may also include singulating a sensor from the wafer (Block 512) and packaging the sensor (Block 514), such as in an ultraviolet sensor package.

The thickness of the substrate (e.g., an SOI substrate) can be tailored to modify received UV/visible wavelength ratios. Additionally, the SOI layer can be configured with horizontal junctions, vertical junctions, ultrashallow dopant profiles through laser annealing techniques, and ultrashallow profiles through Epi growth techniques and/or etching techniques.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A light sensor comprising:
   a substrate having two insulating layers and a surface;
   a photodetector formed in the substrate and disposed between the two insulating layers, the photodetector configured to detect light and to provide a signal in response thereto, the photodetector including a first photodetector and a second photodetector;
   a filter formed via a magnetron sputtering deposition technique proximate the surface of the substrate, the filter comprising a plurality of dielectric layers in a stacked configuration, defining:
      a first filter configured to block light outside of an ultraviolet spectrum of wavelengths in the range of approximately one hundred (100) nanometers to approximately four hundred (400) nanometers, including visible light, and to allow Ultraviolet A light and Ultraviolet B light to pass to the photodetector including the first photodetector and the second photodetector; and
      a second filter configured to block light outside of the Ultraviolet A spectrum from the second photodetector, and to allow Ultraviolet A light to pass to the second photodetector.

2. The light sensor as recited in claim 1, wherein the substrate is a silicon on insulator (SOI) substrate.

3. The light sensor as recited in claim 1, wherein the filter includes hafnium oxide.

4. The light sensor as recited in claim 1, wherein the filter includes a weighting factor to provide a McKinlay-Diffey Erythema Action Spectrum as an output of the photodetector.

5. The light sensor as recited in claim 1, wherein the filter is configured as an intermediate McKinlay-Diffey Erythema Action Spectrum filter that controls an amount of passage of at least one of ultraviolet A light and ultraviolet B light.

6. The light sensor as recited in claim 1, wherein at least a portion of the substrate is configured as at least one of a vertical junction or a horizontal junction.

7. The light sensor as recited in claim 1, further comprising a filter configured to block all light from the photodetector to provide a dark current value from the photodetector.

8. The light sensor as recited in claim 7, further comprising circuitry configured to subtract the dark current from another signal provided from the photodetector when at least a portion of light is passed to the photodetector.

9. The light sensor as recited in claim 1, wherein a signal output from the first photodetector subtracted by a signal output from the second photodetector provides an indication of detected ultraviolet B light.

10. A process comprising:
    forming a photodetector in a substrate having two insulating layers, the photodetector disposed between the two insulating layers and configured to detect light and to provide a signal in response thereto, the photodetector including a first photodetector and a second photodetector;
    forming a filter via a magnetron sputtering deposition technique proximate to and on a surface of the substrate, the filter comprising a plurality of dielectric layers in a stacked configuration, defining:
       a first filter configured to block light outside of an ultraviolet spectrum of wavelengths in the range of approximately one hundred (100) nanometers to approximately four hundred (400) nanometers, including visible light, and to allow Ultraviolet A light and Ultraviolet B light to pass to the photodetector including the first photodetector and the second photodetector; and
       a second filter configured to block light outside of the Ultraviolet A spectrum from the second photodetector, and to allow Ultraviolet A light to pass to the second photodetector.

11. The process as recited in claim 10, wherein forming a filter on the surface of the substrate includes coating a portion of a wafer with a photoresist, the wafer comprising the substrate.

12. The process as recited in claim 11, further including depositing a filter material onto the surface.

13. The process as recited in claim 12, further including performing a lift off technique to remove the photoresist.

14. The process of claim 10, further including singulating an ultraviolet sensor from a wafer comprising the substrate.

15. The process of claim 14, further including packaging the ultraviolet sensor to form an ultraviolet sensor package.

16. The process of claim 10, further including modifying at least a portion of the substrate via laser annealing to provide a dopant profile.

17. The process of claim 10, further including modifying at least a portion of the substrate via Epi growth to provide a dopant profile.

18. The process of claim 10, further including providing circuitry to subtract a dark current value from the signal provided by the photodetector.

* * * * *